United States Patent
Kim

(10) Patent No.: US 8,268,387 B2
(45) Date of Patent: Sep. 18, 2012

(54) METHOD FOR FORMING METAL LINE OF IMAGE SENSOR

(75) Inventor: Sang Chul Kim, Chungbuk (KR)

(73) Assignee: Dongbu Hitek Co., Ltd., Seoul (KR)

( * ) Notice: Subject to any disclaimer, the term of this patent is extended or adjusted under 35 U.S.C. 154(b) by 439 days.

(21) Appl. No.: 12/608,262

(22) Filed: Oct. 29, 2009

(65) Prior Publication Data

US 2010/0119700 A1  May 13, 2010

(30) Foreign Application Priority Data

Nov. 7, 2008   (KR) .................. 10-2008-0110254

(51) Int. Cl.
*B05D 5/12* (2006.01)
(52) U.S. Cl. .................. 427/97.7; 427/97.2; 427/123
(58) Field of Classification Search .................. 427/97.2, 427/97.7, 123
See application file for complete search history.

(56) References Cited

U.S. PATENT DOCUMENTS

| | | | |
|---|---|---|---|
| 6,376,366 B1 * | 4/2002 | Lin et al. | 438/637 |
| 6,869,810 B2 * | 3/2005 | Joei | 438/14 |
| 7,300,866 B2 * | 11/2007 | Hong | 438/637 |
| 2004/0121583 A1 * | 6/2004 | Bao et al. | 438/627 |
| 2005/0191855 A1 * | 9/2005 | Chen et al. | 438/687 |
| 2007/0077755 A1 * | 4/2007 | Hong | 438/627 |

FOREIGN PATENT DOCUMENTS

| | | |
|---|---|---|
| JP | 2004-095813 A | 3/2004 |
| KR | 10-2002-0068470 A | 8/2002 |
| KR | 10-2006-0006340 A | 1/2006 |

\* cited by examiner

*Primary Examiner* — Brian K Talbot
(74) *Attorney, Agent, or Firm* — Saliwanchik, Lloyd & Eisenschenk

(57) ABSTRACT

Disclosed is a method for forming a metal line. The method includes preparing a semiconductor substrate having a first metal line, performing an oxidation process with respect to the first metal line, performing an oxide removal process to remove an oxide generated in the oxidation process, forming an etch stop layer on the metal line, forming an interlayer dielectric layer on the first metal line, and forming a damascene pattern on the interlayer dielectric layer, and forming a second metal line, which is connected with the first metal line, in the damascene pattern. The oxidation process for the first metal line can include a hydrogen peroxide treatment process using a solution including oxygen. The oxide removal process can be performed by using an oxalic acid (HOOC—COOH) solution.

5 Claims, 4 Drawing Sheets

METHOD FOR FORMING METAL LINE OF IMAGE SENSOR

CROSS-REFERENCE TO RELATED APPLICATION

This application claims the benefit under 35 U.S.C. §119 of Korean Patent Application No. 10-2008-0110254, filed Nov. 7, 2008, which is incorporated herein by reference in its entirety.

FIELD OF THE INVENTION

The present disclosure relates to methods for forming a metal line of an image sensor.

BACKGROUND

A CMOS image sensor is a semiconductor device embedded with an integrated circuit which generally has several hundreds of thousands to several millions of pixels to convert optical energy into an electrical signal such that original images of persons or matters are converted into electrical signals in the image sensor.

FIG. 1 is a view showing the structure of an image sensor according to the related art.

Referring to FIG. 1, a semiconductor substrate 11 is formed therein with a photodiode PD, and formed thereon with a multi-layer metal line structure including a plurality of interlayer dielectric layers ILD1, IMD1, IMD2, IMD3, and ILD2 and metal lines M1, M2, M3, and M4 within the interlayer dielectric layers.

A color filter layer 20 is formed on the uppermost interlayer dielectric layer ILD2 to correspond to the PD, and a microlens 30 is formed on the color filter layer 20 to also correspond to the PD.

Etch stop layers 12 are typically formed in layers between the metal lines and the interlayer dielectric layers for use in performing a dual damascene process for forming the metal lines and vias connecting the metal lines.

For example, when the metal line includes copper, a via and the metal line is formed through the dual damascene process. Copper interconnections have become more widely used as compared to aluminum interconnections because the thickness of the copper interconnection can be more easily reduced as compared with that of an aluminum interconnection. Therefore, as image sensors become more highly integrated, but continue to include a high number of metal lines and interlayer dielectric layers, the copper interconnection is advantageous when a microlens is formed to improve the distance between the microlens and the photodiode.

In addition, because an etch stop layer, which is used in forming a copper line through a dual damascene process, may include silicon nitride ($Si_3N_4$) or silicon carbide (SiC) having a transmittance characteristic inferior to that of silicon oxide ($SiO_2$) used for an insulating layer, a light characteristic may become degraded.

In other words, silicon nitride and silicon carbide have refractive indices of about 2.1 and about 2.4, respectively. Accordingly, if an etch stop layer having a high refractive index is formed between insulting layers that are formed of silicon oxide having a refractive index of about 1.5, light is reflected by the number of metal line layers (due to the number of etch stop layers), so that light loss is increased.

BRIEF SUMMARY

Embodiments of the present invention provide a method for forming a metal line capable of improving a light receiving characteristic of a photodiode.

According to an embodiment, a method for forming a metal line includes preparing a semiconductor substrate having a first metal line, performing an oxidation process with respect to the first metal line, performing an oxide removal process to remove an oxide generated in the oxidation process, forming an etch stop layer only on the metal line, forming an interlayer dielectric layer on the first metal line, including the etch stop layer, forming a damascene pattern on the interlayer dielectric layer, and forming a second metal line, which is connected with the first metal line, in the damascene pattern.

In one embodiment, the oxidation process for the first metal line includes a hydrogen peroxide treatment process using a solution including oxygen.

In a further embodiment, the oxide removal process is performed by using an oxalic acid (HOOC—COOH) solution.

DETAILED DESCRIPTION

Hereinafter, embodiments of a method for forming a metal line of an image sensor will be described in detail with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

It is to be understood that the figures and descriptions of embodiments of the present invention have been simplified to illustrate elements that are relevant for a clear understanding of the invention, while eliminating, for purposes of clarity, other elements that may be well known. Those of ordinary skill in the art will recognize that other elements may be desirable and/or required in order to implement the present invention. However, because such elements are well known in the art, and because they do not facilitate a better understanding of the present invention, a discussion of such elements is not provided herein.

Figure 1:
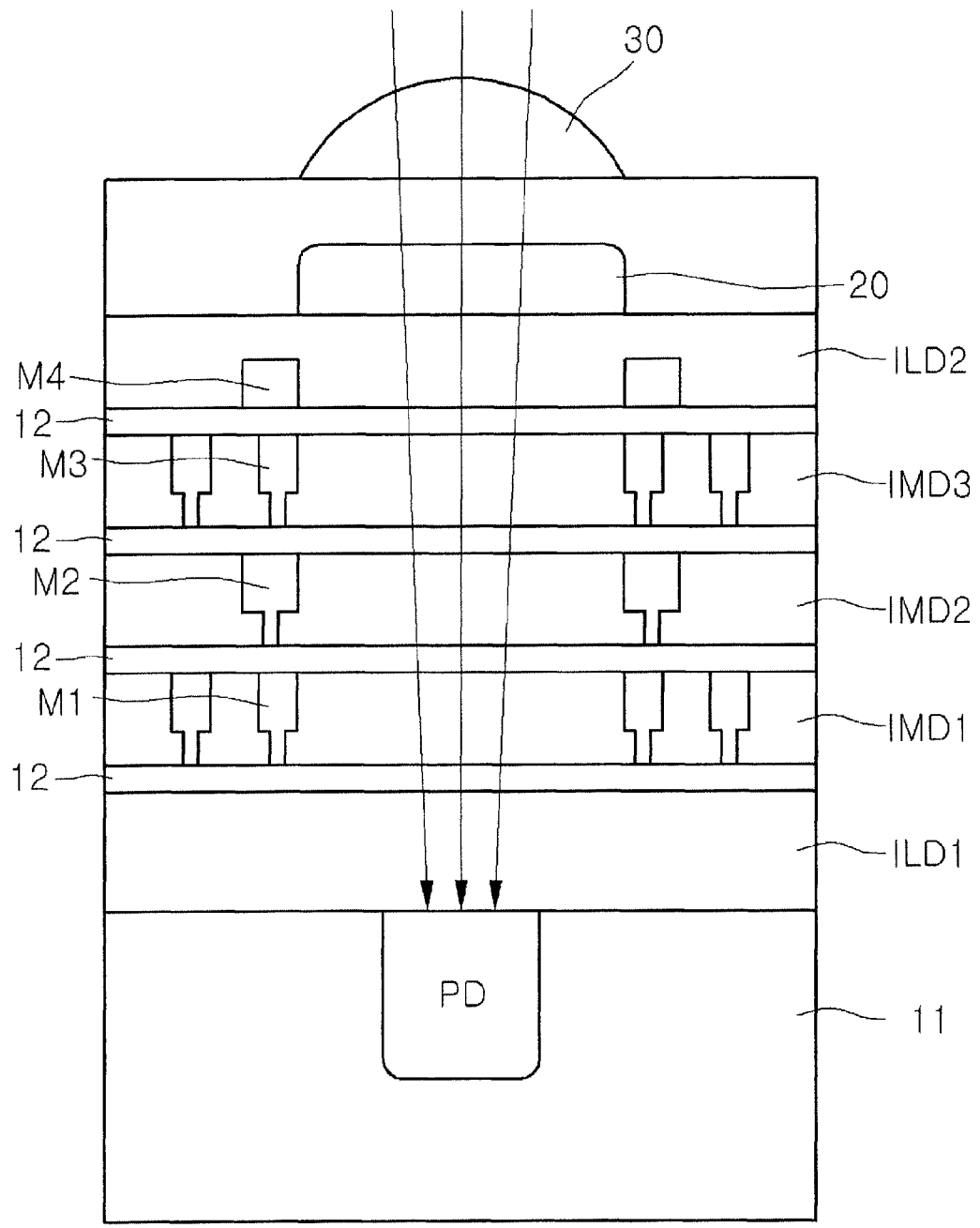
FIG. 1 is a view showing the structure of an image sensor according to the related art.
Figure 2:
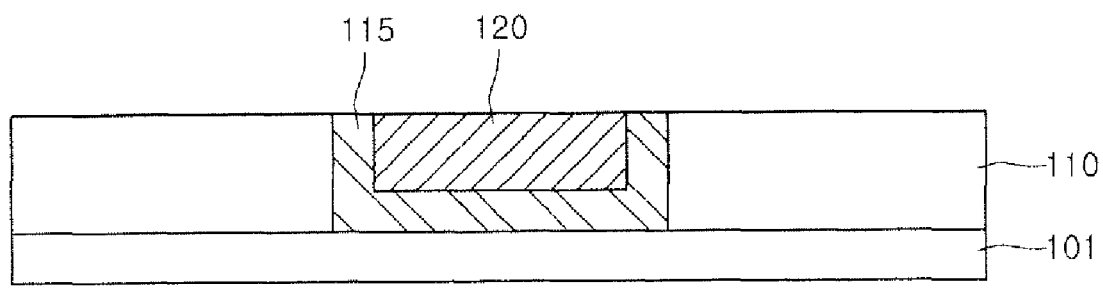
FIGS. 2 to 8 are cross-sectional views for explaining a method for forming a metal line of an image sensor according to an embodiment.

Referring to FIG. 2, a semiconductor substrate 101 can be prepared having a plurality of semiconductor structures (not shown), and a first interlayer dielectric layer 110 is deposited on the semiconductor substrate 101. The first interlayer dielectric layer 110 may include boron phosphorus silicate glass (BPGS), phosphorus silicate glass (PSG), un-doped silicate glass (USG), fluorinated silicate glass (FSG), a $SiO_2$ layer, or an oxide layer formed by bonding $SiO_2$ with hydrogen (H), fluorine (F), or carbon (C).

The semiconductor structures of the semiconductor substrate 101 can include, but are not limited to, a photodiode, a transistor, a junction layer, a conductive layer, and an insulating layer, and may be formed through techniques well-known to the skilled in the art.

After the first interlayer dielectric layer 110 has been formed, a planarization process may be additionally formed. The planarization process may be a chemical mechanical polishing (CMP) scheme.

Next, the first interlayer dielectric layer 110 is patterned through a photolithography process, thereby forming a contact hole (not shown) and a trench over the contact hole. A top surface of one of the semiconductor structures may be exposed through the contact hole. In this case, the contact hole and trench are formed at a non-overlap area with the photodiode. By forming contact holes for vias and trenches for metal lines at a non-overlap area with the photodiode, light incident onto the photodiode from an exterior can be inhibited from being influenced by a metallic layer formed in the contact holes and trenches.

A first barrier layer 115 is formed along a step of the entire top surface of the semiconductor structures including the contact hole and trench. The first barrier layer 115 can include at least one of tantalum (Ta), tantalum-nitrogen (TaN), tantalum-carbon (TaC), tantalum-aluminum-nitrogen (TaAlN), tantalum-silicon-nitrogen (TaSiN), tantalum-silicon (TaSi$_2$), titanium (Ti), titanium-nitrogen (TiN), titanium-silicon-nitrogen (TiSiN), tungsten-nitrogen (WN), tungsten-boron-nitrogen (WBN), tungsten-carbon (WC), cobalt (Co) and cobalt-silicon (CoSi$_2$) or a stacked structure having at least two layers thereof. If the first barrier layer 115 has a stacked structure of Ti/TiN, the Ti layer may serve as an adhesion layer. This is because the TiN layer has low adhesive strength with a lower layer due to an inferior adhesive property.

According to an embodiment, the first barrier layer 115 may be deposited through, for example, physical vapor chemical vapor deposition (PVD), chemical vapor deposition (CVD), or atomic layer deposition (ALD). Thereafter, a first metal line 120 can be formed on the resultant structure having the first barrier layer 115.

Preferably, the material for the first metal line 120 is deposited such that voids are not created in the contact hole. The material for the first metal line 120 may be deposited through, for example, CVD, PVD, ALD, an electroless plating scheme, or an electroplating scheme.

The metal line 120 may be formed of conductive metal materials. The metal line 120 may include aluminum (Al), tungsten (W), copper (Cu), or platinum (Pt). Meanwhile, in one embodiment, before the conductive metal material for the first metal line 120 is deposited, a seed layer can be deposited in the contact hole. The seed layer may include Cu or an alloy of Cu. The alloy of Cu may include, but is not limited to, magnesium (Mg), tin (Sn), Al, palladium (Pd), Ti, niobium (Nb), hafnium (Hf), zirconium (Zr), strontium (Sr), manganese (Mn), cadmium (Cd), zinc (Zn), or silver (Ag).

Figure 3:
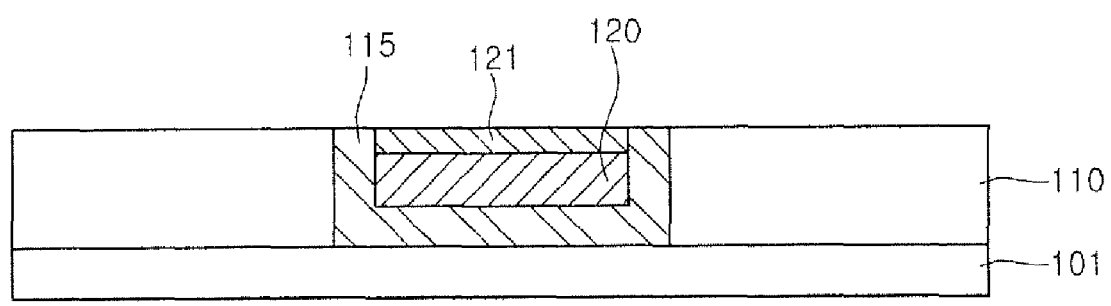

Thereafter, referring to FIG. 3, the upper portion of the first metal line 120 may be oxidized through an oxidation process.

For example, the oxidation process for the first metal interconnection 120 can include a treatment process using a solution including oxygen. Through the oxidation process, a copper-oxide (Cu-Oxide) layer 121 is formed to a predetermined depth from the top surface of the first metal line 120.

The oxidation process can be a hydrogen peroxide treatment process using a solution of H$_2$O$_2$.

Figure 4:
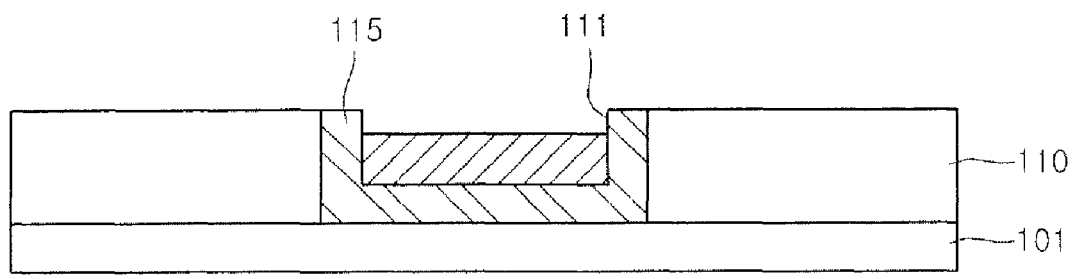

Thereafter, referring to FIG. 4, the Cu-oxide layer 121 is removed from the top surface of the first metal line 120 through an oxide removal process.

The oxide removal process can be performed by pouring an oxalic acid onto the semiconductor substrate 101. In a specific embodiment, HOOC—COOH solution having the concentration of 0.1% can be poured onto a rotating semiconductor substrate 101 at a flow rate of 1.01 sccm for 30 seconds. The HOOC-CCOH does not form a complex with copper bonded to metal, but forms a chelate complex with copper oxide. For this reason, the HOOC—COOH can dissolve the Cu-oxide 121 without causing damage to the surface of a copper layer that is not oxidized.

Accordingly, without damaging the body of the first metal line 120, the Cu-oxide layer 121 is oxidized so that a step 111 having a predetermined depth is generated between the first metal line 120 and the first interlayer dielectric layer 110 as shown in FIG. 4.

The use amount of the HOOC—COOH and the time to pour the HOOC—COOH can be adjusted according to the thickness of the Cu-oxide layer 121.

Figure 5:
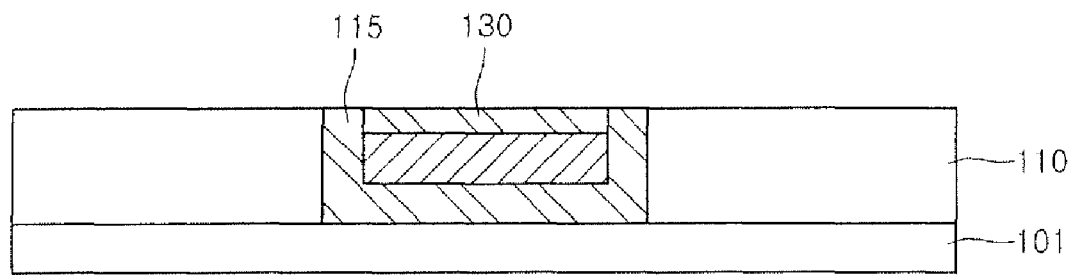

Referring to FIG. 5, a first etch stop layer 130 is deposited on a region where the Cu-oxide layer 121 has been removed. The first etch stop layer 130 can inhibit the first metal line 120 from being damaged when a via hole is formed in the following process. The first etch stop layer 130 may include a nitride-based material having conductivity and high etching selectivity with an oxide layer. The first etch stop layer 130 may be deposited through, for example, a PVD scheme, a CVD scheme, or an ALD scheme.

A planarization process is performed with respect to an upper portion of the etch stop layer 130, so that the etch stop layer 130 is filled in the region where the Cu-oxide 121 is removed as shown in drawings.

Figure 6:
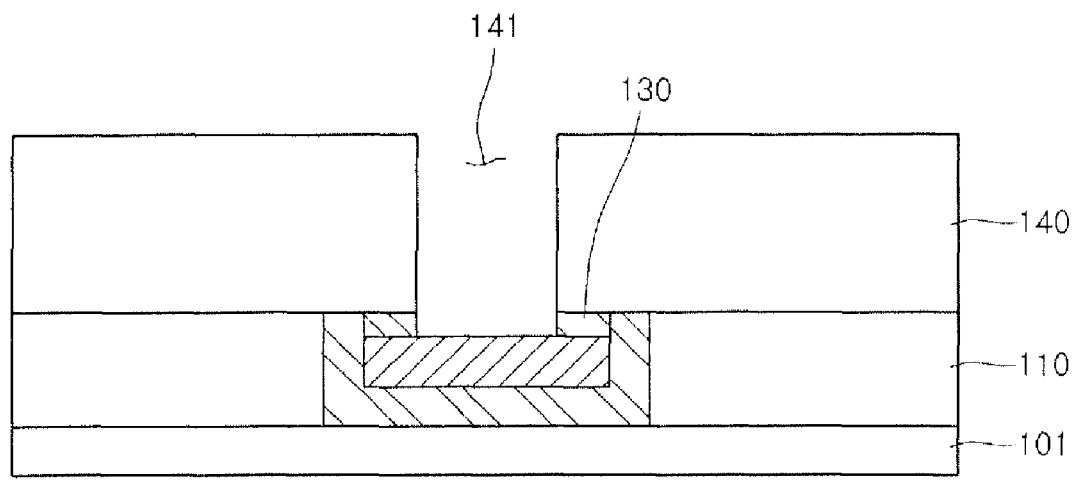

Then, as shown in FIG. 6, a second interlayer dielectric layer 140 is deposited on the semiconductor substrate 101 having the first etch stop layer 130. The second interlayer dielectric layer 140 may be formed in a single layer structure or a stacked layer structure by using a material the same as that of the first interlayer dielectric layer 110.

A dual damascene process will be described with reference to FIGS. 6 and 7. For example, the dual damascene process can be performed with respect to the second interlayer dielectric layer 140 to form a via hole 141 and a trench 142 in the second interlayer dielectric layer 140.

In detail, according to one embodiment, a via hole 141 may be formed in the second interlayer dielectric layer 140 by etching the second interlayer dielectric layer 140 using a photoresist pattern (not shown) that is formed on the second interlayer dielectric layer 140 as an etch mask. Portions of the second interlayer dielectric layer 140 and the first etch stop layer 130 may be etched at this time. Accordingly, the via hole 141 is formed to expose a portion of the first metal line 120.

Figure 7:
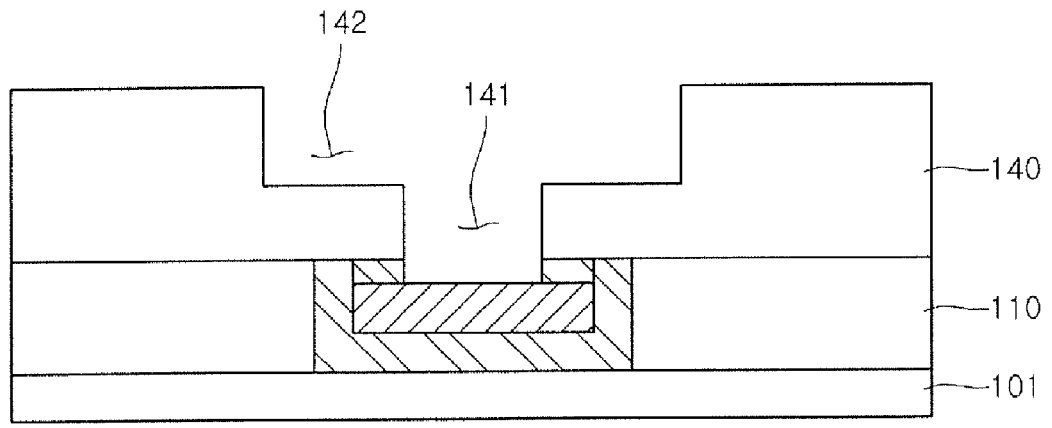

Referring to FIG. 7, the trench 142 can be formed over the via hole 141 and having a width wider than the via hole 141 by etching the second interlayer dielectric layer 140 using a second photoresist pattern (not shown) that is formed on the second interlayer dielectric layer 140 as an etch mask.

The photoresist patterns used in the above described etch processes can be removed through an ashing process or a recess process.

Figure 8:
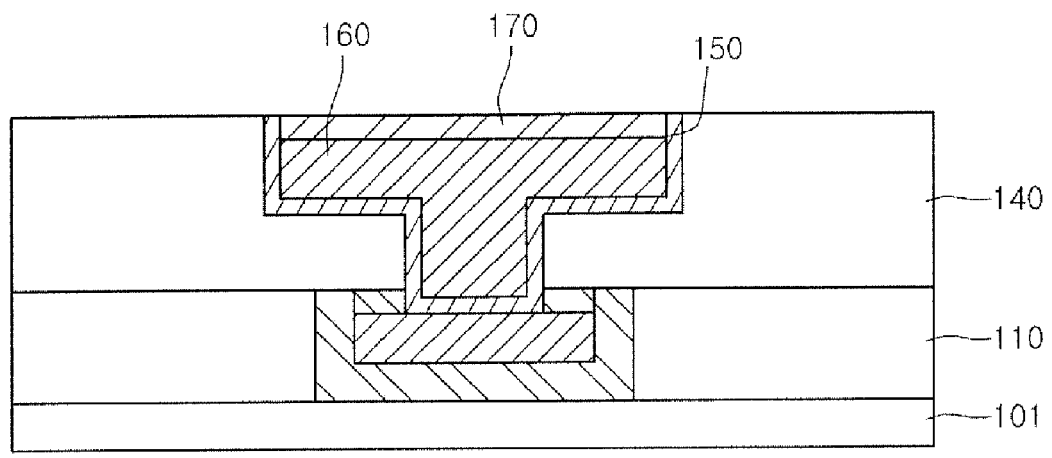

Thereafter, referring to FIG. 8, a second barrier layer 150 is formed in the via hole 141 and the trench 142.

The second barrier layer 150 may be formed in a single layer structure or a stacked layer structure by using a material the same as that of the first barrier layer 115.

Next, a second metal line 160 is formed in the via hole 141 and the trench 142 formed with the second barrier layer 150.

Thereafter, an oxidation process to form an Cu-oxide layer and an oxide removal process to remove the Cu-oxide layer, which have already described with reference to FIGS. 3 to 5, are performed to form a second etch stop layer 170 as shown in FIG. 8.

As described above, according to embodiments, an etch stop layer is not formed on a light incident path from an exterior to a photodiode, but formed only at the upper portion of a metal line, so that light can be stably transmitted from a microlens to the photodiode.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for forming a metal line, comprising:
    preparing a semiconductor substrate having a first metal line;
    performing an oxidation process with respect to the first metal line;
    performing an oxide removal process to remove an oxide of the first metal line generated in the oxidation process;
    forming an etch stop layer on the first metal line only on an area where the oxide of the first metal line has been removed;
    forming an interlayer dielectric layer on the first metal line including the etch stop layer, and forming a damascene pattern on the interlayer dielectric layer; and
    forming a second metal line, which is connected with the first metal line, in the damascene pattern.

2. The method of claim 1, wherein performing the oxidation process with respect to the first metal line comprises using a solution including oxygen.

3. The method of claim 2, wherein using the solution including oxygen comprises using a hydrogen peroxide ($H_2O_2$) solution.

4. The method of claim 1, wherein performing the oxide removal process comprises using a solution that forms a chelate complex with copper oxide.

5. The method of claim 4, wherein the solution is an oxalic acid (HOOC—COOH) solution.

* * * * *